United States Patent
Lee et al.

(10) Patent No.: US 9,865,504 B2
(45) Date of Patent: Jan. 9, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Wei-Yang Lee, Taipei (TW); Feng-Cheng Yang, Hsinchu County (TW); Ting-Yeh Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/061,609

(22) Filed: Mar. 4, 2016

(65) Prior Publication Data
US 2017/0256456 A1    Sep. 7, 2017

(51) Int. Cl.
| H01L 21/8234 | (2006.01) |
| H01L 27/088 | (2006.01) |
| H01L 29/08 | (2006.01) |
| H01L 21/308 | (2006.01) |

(52) U.S. Cl.
CPC .. *H01L 21/823431* (2013.01); *H01L 21/3081* (2013.01); *H01L 21/3083* (2013.01); *H01L 21/823425* (2013.01); *H01L 27/0886* (2013.01); *H01L 29/0847* (2013.01)

(58) Field of Classification Search
None
See application file for complete search history.

(56) References Cited

U.S. PATENT DOCUMENTS

| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |

(Continued)

FOREIGN PATENT DOCUMENTS

| KR | 10-2014-0029094 A | 3/2014 |
| KR | 10-2015-0044804 A | 4/2015 |

OTHER PUBLICATIONS

Office Action Taiwanese Patent Application No. 105126057 dated Jan. 25, 2017.

(Continued)

*Primary Examiner* — Abul Kalam
(74) *Attorney, Agent, or Firm* — McDermott Will and Emery LLP

(57) ABSTRACT

A semiconductor device includes an isolation layer disposed over a substrate, first and second fin structures, a gate structure, a source/drain structure and a dielectric layer disposed on an upper surface of the isolation insulating layer. Both the first fin structure and the second fin structure are disposed over the substrate, and extend in a first direction in plan view. The gate structure is disposed over parts of the first and second fin structures, and extends in a second direction crossing the first direction. The first and second fin structures not covered by the gate structure are recessed below the upper surface of the isolation insulating layer. The source/drain structure is formed over the recessed first and second fin structures. A void is formed between the source/drain structure and the dielectric layer.

20 Claims, 8 Drawing Sheets

(56) References Cited

U.S. PATENT DOCUMENTS

| | | | |
|---|---|---|---|
| 8,946,029 B2* | 2/2015 | Wong | H01L 21/823418 |
| | | | 257/E21.158 |
| 9,379,217 B2* | 6/2016 | Ho | H01L 29/66795 |
| 9,390,977 B2* | 7/2016 | Han | H01L 21/3081 |
| 2010/0248454 A1 | 9/2010 | Maszara et al. | |
| 2011/0210404 A1* | 9/2011 | Su | H01L 29/785 |
| | | | 257/401 |
| 2014/0065782 A1* | 3/2014 | Lu | H01L 29/785 |
| | | | 438/294 |
| 2014/0203338 A1 | 7/2014 | Kelly et al. | |
| 2014/0239354 A1 | 8/2014 | Huang et al. | |
| 2014/0282326 A1 | 9/2014 | Chen et al. | |
| 2015/0079751 A1* | 3/2015 | Alptekin | H01L 29/785 |
| | | | 438/283 |
| 2015/0099336 A1* | 4/2015 | Wong | H01L 21/823418 |
| | | | 438/229 |
| 2015/0187943 A1* | 7/2015 | Lee | H01L 29/785 |
| | | | 257/192 |
| 2016/0005656 A1 | 1/2016 | Ching et al. | |
| 2016/0343708 A1* | 11/2016 | Park | H01L 27/0886 |

OTHER PUBLICATIONS

Office Action issued in corresponding Korean Application No. 10-2016-0137623, dated Oct. 23, 2017.

\* cited by examiner

SEMICONDUCTOR DEVICE AND MANUFACTURING METHOD THEREOF

TECHNICAL FIELD

The disclosure relates to a semiconductor integrated circuit, and more particularly to a semiconductor device having an epitaxial source/drain (S/D) structure with voids and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
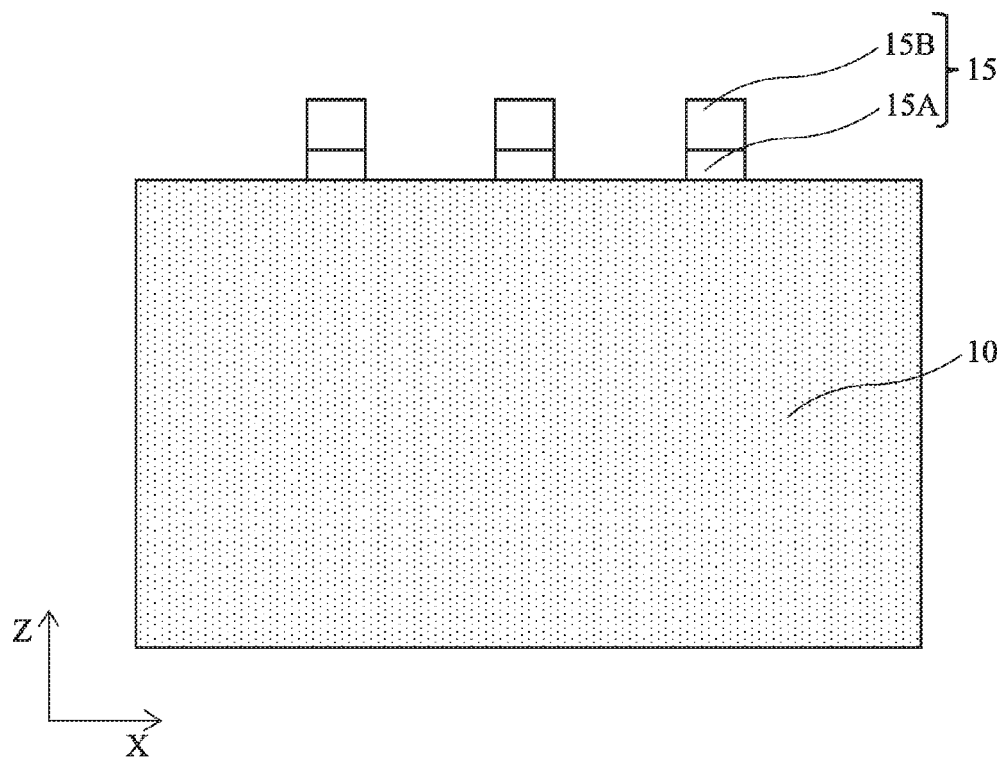
FIGS. 1-12 show exemplary cross sectional views of various stages for manufacturing a Fin FET device according to one embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

FIGS. 1-12 show exemplary cross sectional views of various stages for manufacturing a Fin FET device according to one embodiment of the present disclosure. It is understood that additional operations can be provided before, during, and after processes shown by FIGS. 1-12, and some of the operations described below can be replaced or eliminated, for additional embodiments of the method. The order of the operations/processes may be interchangeable.

A mask layer 15 is formed over a substrate 10. The mask layer 15 is formed by, for example, a thermal oxidation process and/or a chemical vapor deposition (CVD) process. The substrate 10 is, for example, a p-type silicon or germanium substrate with an impurity concentration in a range from about $1 \times 10^{15}$ cm$^{-3}$ to about $1 \times 10^{16}$ cm$^{-3}$. In other embodiments, the substrate is an n-type silicon or germanium substrate with an impurity concentration in a range from about $1 \times 10^{15}$ cm$^{-3}$ to about $1 \times 10^{16}$ cm$^{-3}$.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 15 includes, for example, a pad oxide (e.g., silicon oxide) layer 15A and a silicon nitride mask layer 15B in some embodiments.

The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

By using the mask pattern as an etching mask, a hard mask pattern 15 of the pad oxide layer and the silicon nitride mask layer is formed, as shown in FIG. 1.

Figure 2:
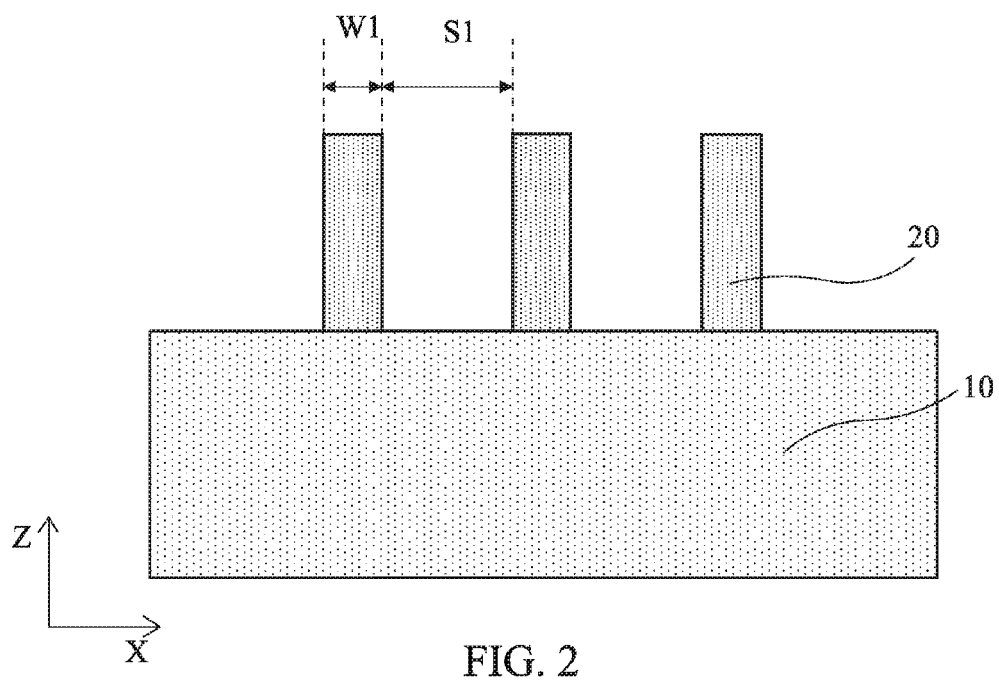

Then, as shown in FIG. 2, by using the hard mask pattern 15 as an etching mask, the substrate 10 is patterned into fin structures 20 by trench etching using a dry etching method and/or a wet etching method.

In FIG. 2, three fin structures 20 are disposed over the substrate 10. However, the number of the fin structures is not limited to three. The numbers may be as small as one or more than three. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 5 nm to about 40 nm in some embodiments, and is in a range from about 7 nm to about 12 nm in other embodiments. The space 51 between two fin structures is in a range from about 10 nm to about 50 nm in some embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIG. 5A) may be referred to as a well region, and the upper part of the fin structure 20 may be referred to as a channel region. Under the gate structure 40, the well region is embedded in the isolation insulating layer 30 (see, FIG. 5A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Figure 3:
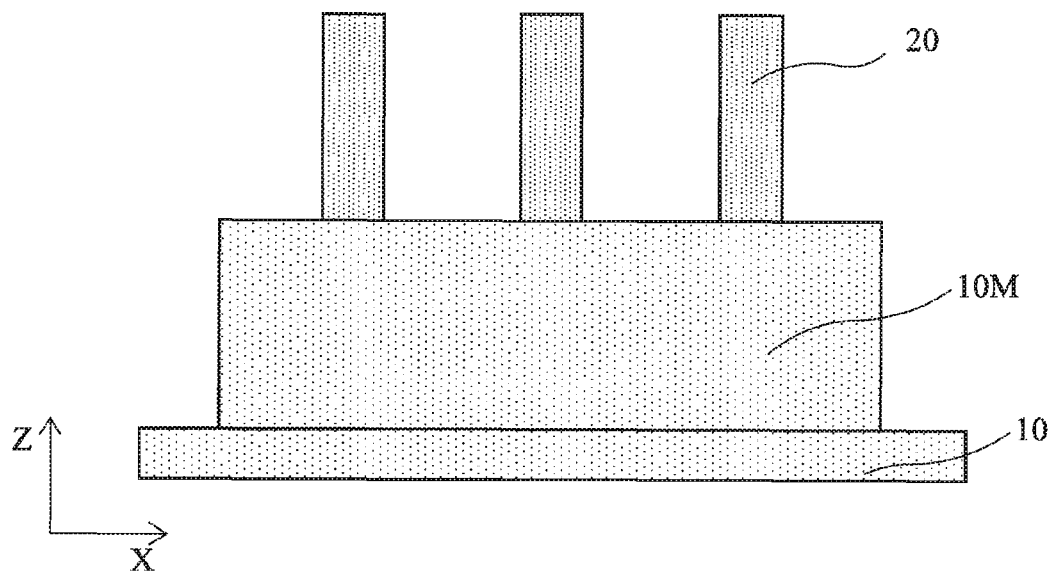

After the fin structures 20 are formed, the substrate 10 is further etched to form a mesa shape 10M, as shown in FIG. 3. In other embodiments, the mesa shape 10M is first formed, and then the fin structures 20 are formed.

After the fin structures 20 and the mesa shape 10M are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 4:
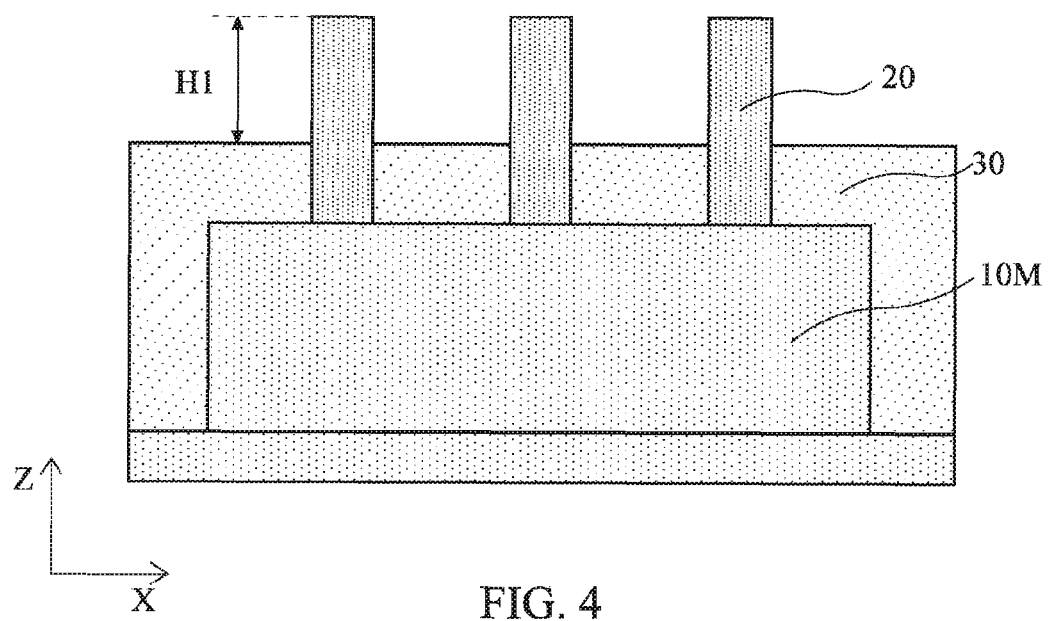

The insulating layer 30 is first formed in a thick layer so that the fin structures are embedded in the thick layer, and the thick layer is recessed so as to expose the upper portions of the fin structures 20, as shown in FIG. 4. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 5A:
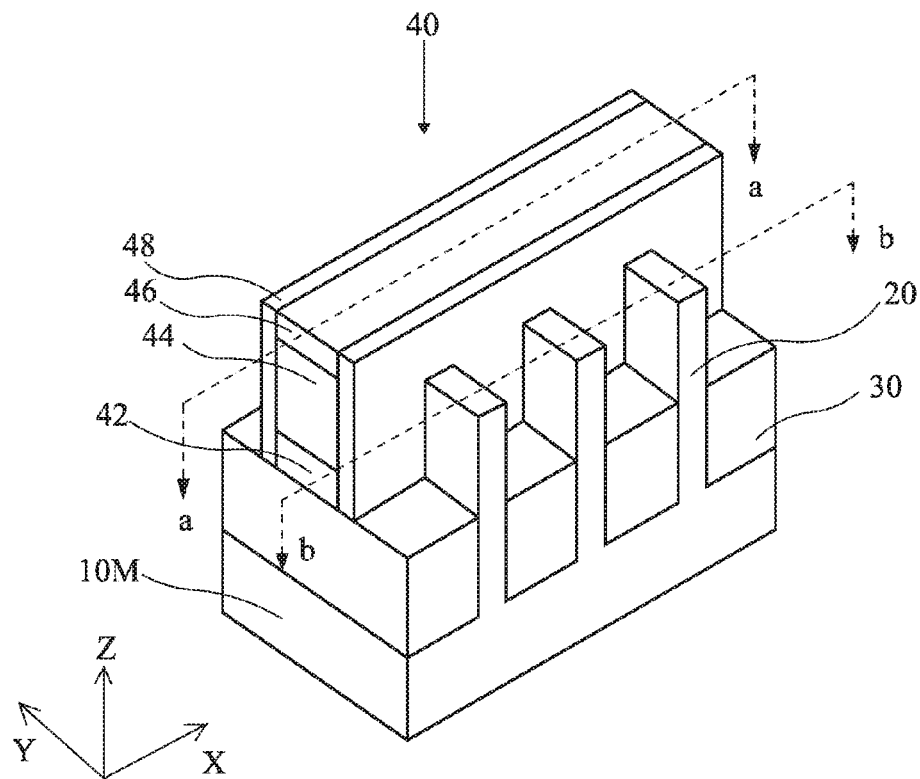
Figure 5B:
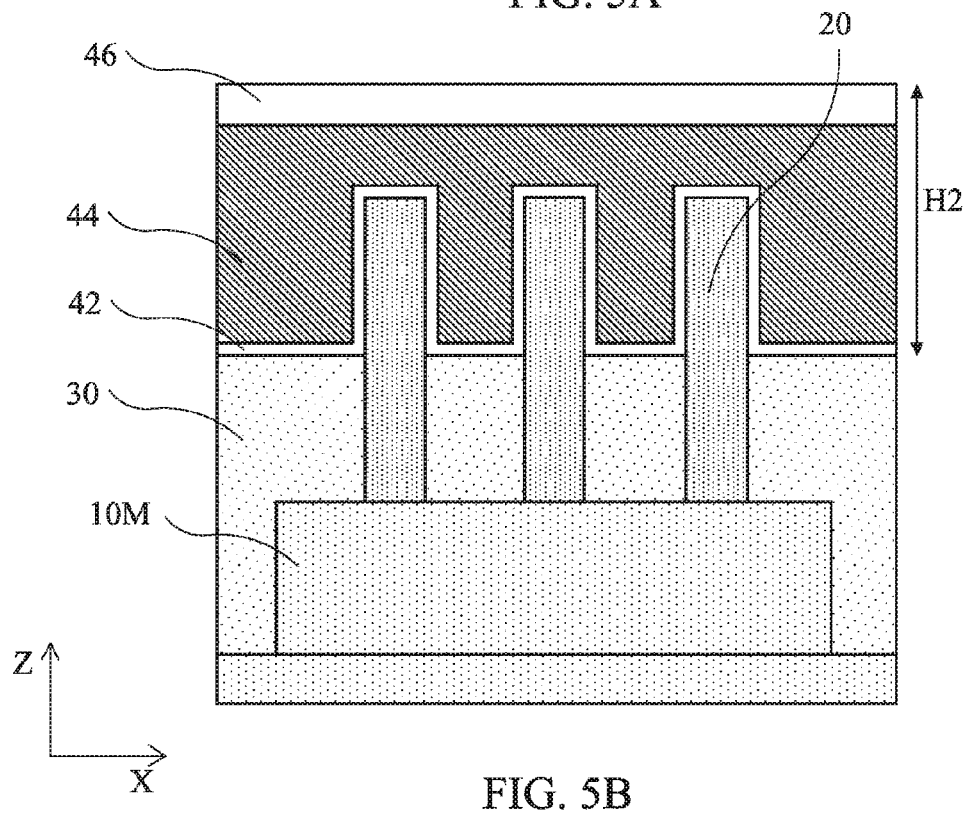
Figure 5C:
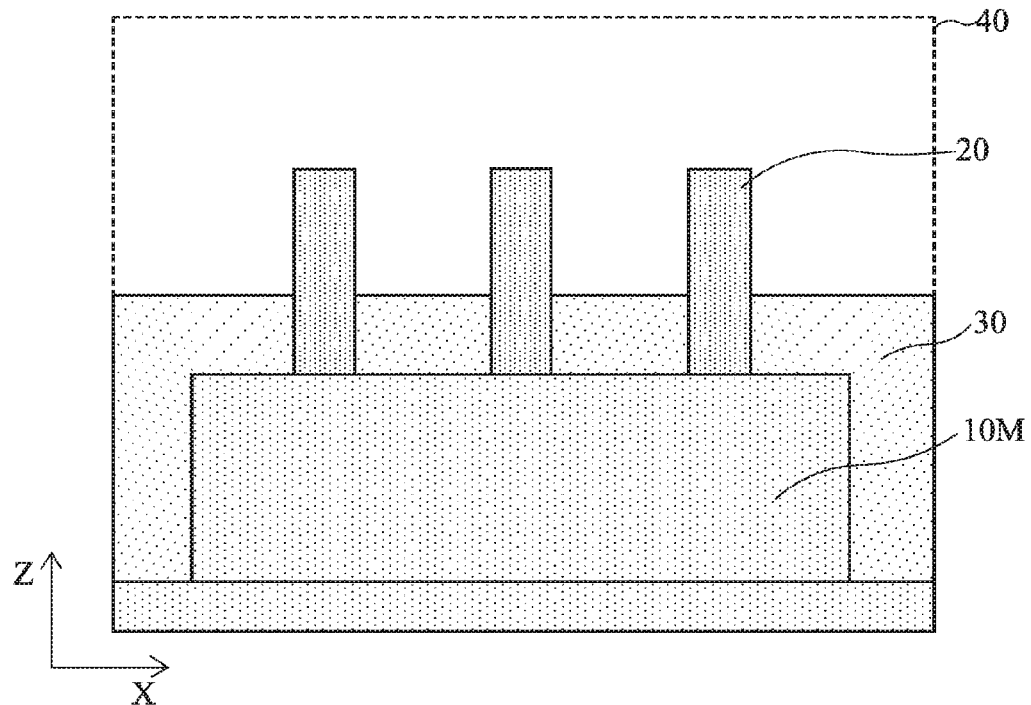

After the insulating layer 30 is formed, a gate structure 40 is formed over the fin structures 20, as shown in FIGS. 5A-5C. FIG. 5A is an exemplary perspective view, FIG. 5B is an exemplary cross sectional view along line a-a of FIG. 5A and FIG. 5C is an exemplary cross sectional view along line b-b of FIG. 5A. FIGS. 6-14 are also exemplary cross sectional views along line b-b of FIG. 5A.

As shown in FIG. 5A, the gate structure 40 extends in the X direction, while the fin structures 20 extend in the Y direction.

To fabricate the gate structure 40, a dielectric layer and a poly silicon layer are formed over the isolation insulating layer 30 and the exposed fin structures 20, and then patterning operations are performed so as to obtain gate structures including a gate pattern 44 made of poly silicon and a dielectric layer 42. In some embodiments, the polysilicon layer is patterned by using a hard mask and the hard mask remains on the gate pattern 44 as a cap insulating layer 46. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process. In some embodiments, the dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. The height H2 of the gate structures is in a range from about 50 nm to about 400 nm in some embodiments, and is in a range from about 100 nm to 200 nm in other embodiments.

In some embodiments, a gate replacement technology is employed. In such a case, the gate pattern 44 and the dielectric layer 42 are a dummy gate electrode and a dummy gate dielectric layer, respectively, which are subsequently removed. If a gate-first technology is employed, the gate pattern 44 and the dielectric layer 42 are used as a gate electrode and a gate dielectric layer.

Further, gate sidewall spacers 48 are formed on both sidewalls of the gate pattern. The sidewall spacers 48 include one or more layers of insulating material, such as SiO$_2$, SiN, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material and performing anisotropic etching. In one embodiment, the sidewall spacer layers are made of silicon nitride based material, such as SiN, SiON, SiOCN or SiCN.

Figure 6:
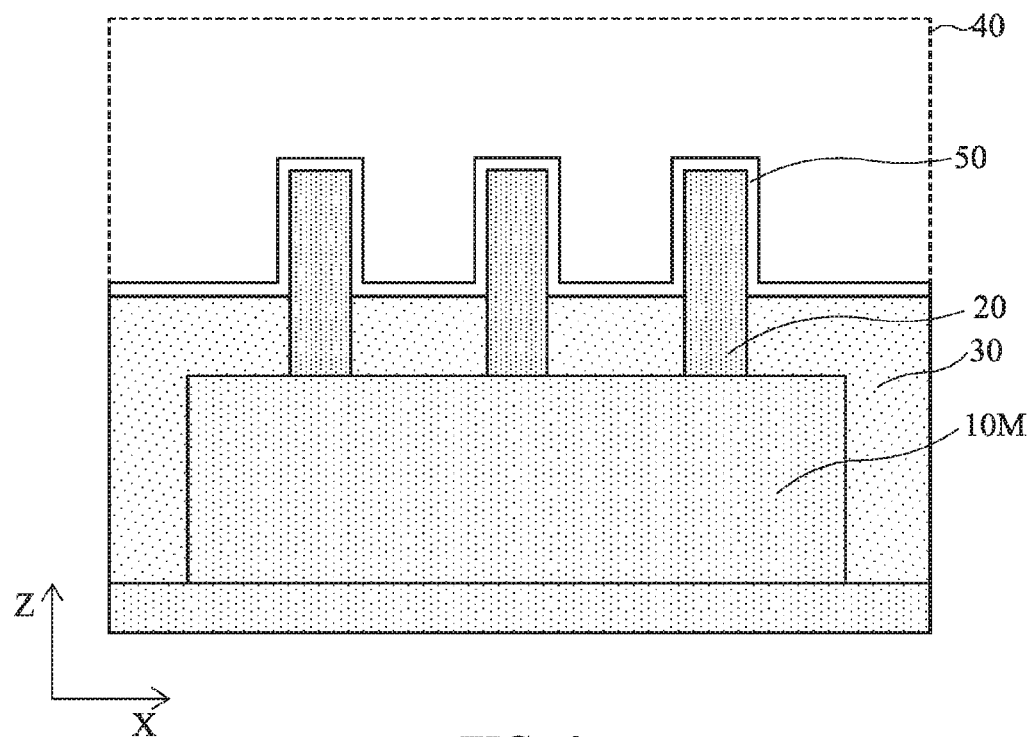

Then, as shown in FIG. 6, a fin mask layer 50 is formed over the fin structures 20. The fin mask layer 50 is made of dielectric material including silicon nitride based material, such as SiN, SiON, SiOCN or SiCN. In one embodiment, SiN is used as the fin mask layer 50. The fin mask layer 50 is formed by CVD, PVD, ALD, e-beam evaporation, or other suitable process. The thickness of the fin mask layer 50 is in a range from about 30 nm to about 70 nm in some embodiments.

In some embodiments, the fin mask layer 50 and the sidewall spacers 48 for the gate structure are separately formed. In other embodiments, the same blanket layer is used for the fin mask layer 50 and the sidewall spacers 48.

Figure 7:
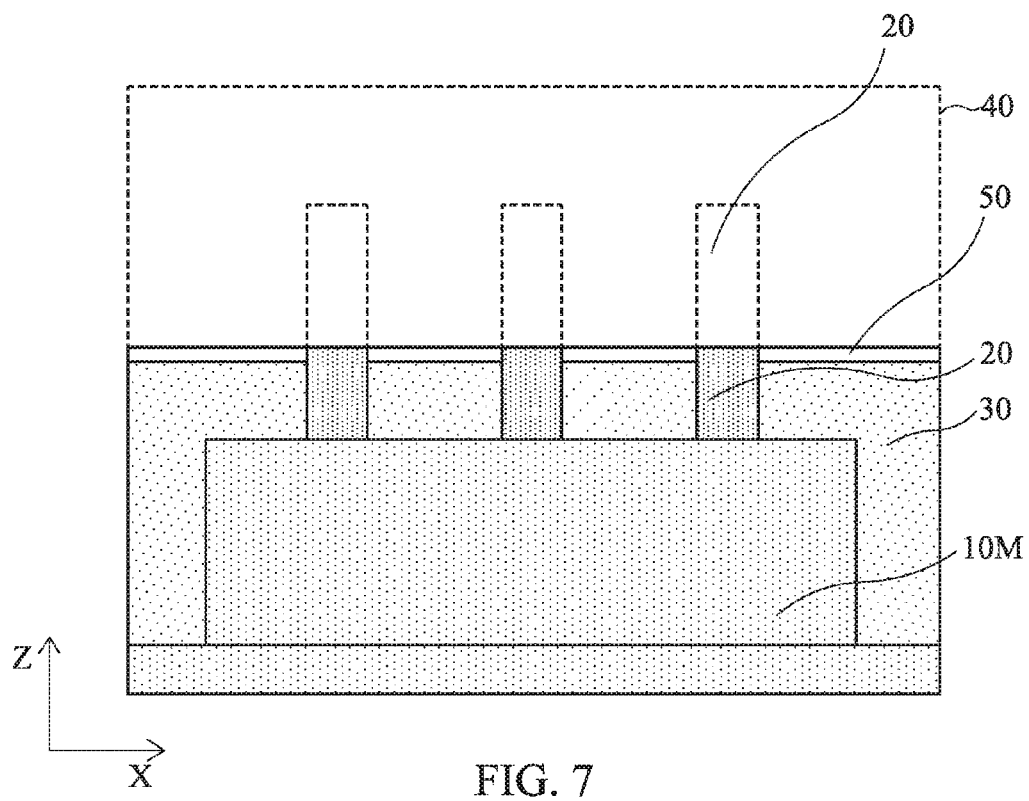

After forming the fin mask layer 50, the upper portion of the fin structures 20 are recessed and a part of the fin mask layer 50 disposed on side surfaces and the top surface of the fin structures protruding from the isolation insulating layer are removed by a dry etching and/or a wet etching operation. The upper portion of the fin structures 20 are recessed (etched) down to the level equal to or below the upper surface of the fin mask layer 50 on the upper surface isolation insulating layer 30, as shown in FIG. 7. By adjusting etching conditions, for example, an over-etching time, the fin mask layer 50 remains on the upper surface of the isolation insulating layer 30. The thickness of the remaining fin mask layer 50 is in a range from about 2 nm to about 10 nm in some embodiments.

Figure 8:
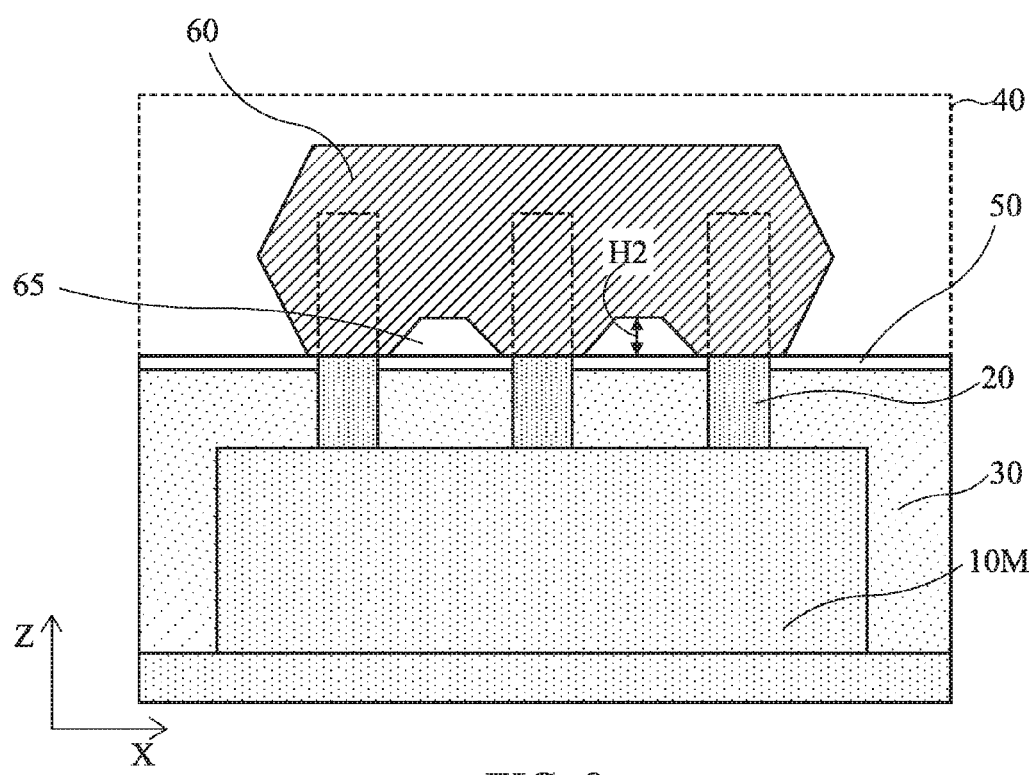

Then, as shown in FIG. 8, an epitaxial source/drain structure 60 is formed over the recessed fin structures 20. The epitaxial source/drain structure 60 is made of one or more layers of semiconductor material having a different lattice constant than the fin structures 20 (channel regions). When the fin structures are made of Si, the epitaxial source/drain structure 60 includes SiP, SiC or SiCP for an n-channel Fin FET and SiGe or Ge for a p-channel Fin FET. The epitaxial source/drain structure 60 is epitaxially formed over the upper portions of the recessed fin structures. Due to the crystal orientation of the substrate formed into the fin structures 20 (e.g., (100) plane), the epitaxial source/drain structure 60 grows laterally and have a diamond-like shape.

The source/drain epitaxial layer 60 may be grown at a temperature of about 600 to 800° C. under a pressure of about 80 to 150 Torr, by using a Si containing gas such as SiH$_4$, Si$_2$H$_6$ or SiCl$_2$H$_2$, a Ge containing gas, such as GeH$_4$, Ge$_2$H$_6$ or GeCl$_2$H$_2$, a C containing gas, such as CH$_4$ or C$_2$H$_6$, and/or a dopant gas, such as PH$_3$. The source/drain structure for an n-channel FET and the source/drain structure for a p-channel FET may be formed by separate epitaxial processes.

Due to the relatively small space between the fin structures and the fin mask layer 50 remaining on the upper surface of the isolation insulating layer between the fin structures, the adjacent epitaxial source/drain structures formed over each of the first fin structures 20 are merged such that a void or a gap (an air gap) 65 is formed by the merged second epitaxial source/drain structure 60 and the fin mask layer 50 on the upper surface of the isolation insulating layer 30, as shown in FIG. 8.

In particular, due to the fin mask layer 50 on the upper surface of the isolation insulating layer 30, the height H2 of the void 65 is larger than the case where no fin mask layer 50 remains on the upper surface of the isolation insulating layer 30. In some embodiments, the height H2 of the void is in a range from about 10 nm to about 30 nm measured from the upper surface of fin mask layer 50, and in a range from about 15 nm to about 25 nm in other embodiments. In addition, due to the remaining fin mask layer 50, the isolation insulting layer 30 is protected during the fin etching.

Figure 9:
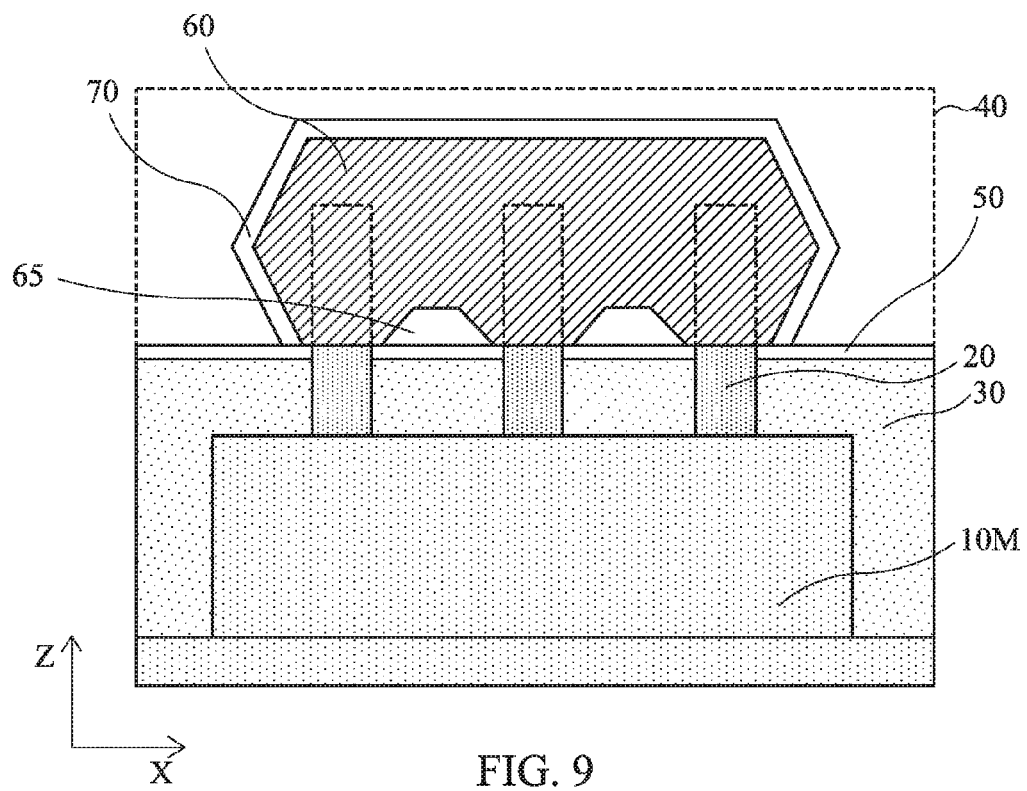

After the epitaxial source/drain structure 60 is formed, as shown in FIG. 9, a silicide layer 70 is formed over the epitaxial source/drain structure 60.

A metal material, such as Ni, Ti, Ta and/or W, is formed over the epitaxial source/drain structure 60, and an annealing operation is performed to form a silicide layer 70. In other embodiments, a silicide material, such as NiSi, TiSi, TaSi and/or WSi, is formed over the epitaxial source/drain structure 60, and an annealing operation may be performed. The annealing operation is performed at a temperature of about 250° C. to about 850° C. The metal material or the silicide material is formed by CVD or ALD. The thickness of the silicide layer 70 is in a range from about 4 nm to about 10 nm in some embodiments. Before or after the annealing operations, the metal material or the silicide material formed over the isolation insulating layer 30 is selectively removed.

Then, a metal gate structure (not shown) is formed. After forming the silicide layer 70, the dummy gate structures (dummy gate electrode 44 and dummy gate dielectric layer 42) are removed and replaced with a metal gate structures (metal gate electrode and gate dielectric layer).

In certain embodiments, a first interlayer dielectric layer is formed over the dummy gate structures and a planarization operation, such as a chemical mechanical polishing (CMP) process or an etch-back process, is performed to expose the upper surface of the dummy gate electrode 44. Then, the dummy gate electrode 44 and the dummy gate dielectric layer 42 are removed, by appropriate etching processes, respectively, to form a gate opening. Metal gate structures including a gate dielectric layer and metal gate electrode are formed in the gate openings.

The gate dielectric layer may be formed over an interface layer (not shown) disposed over the channel layer of the fin structures 20. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer includes one or more layers of dielectric materials, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode is formed over the gate dielectric layer. The metal gate electrode includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations, such as CMP, are performed.

Figure 10:
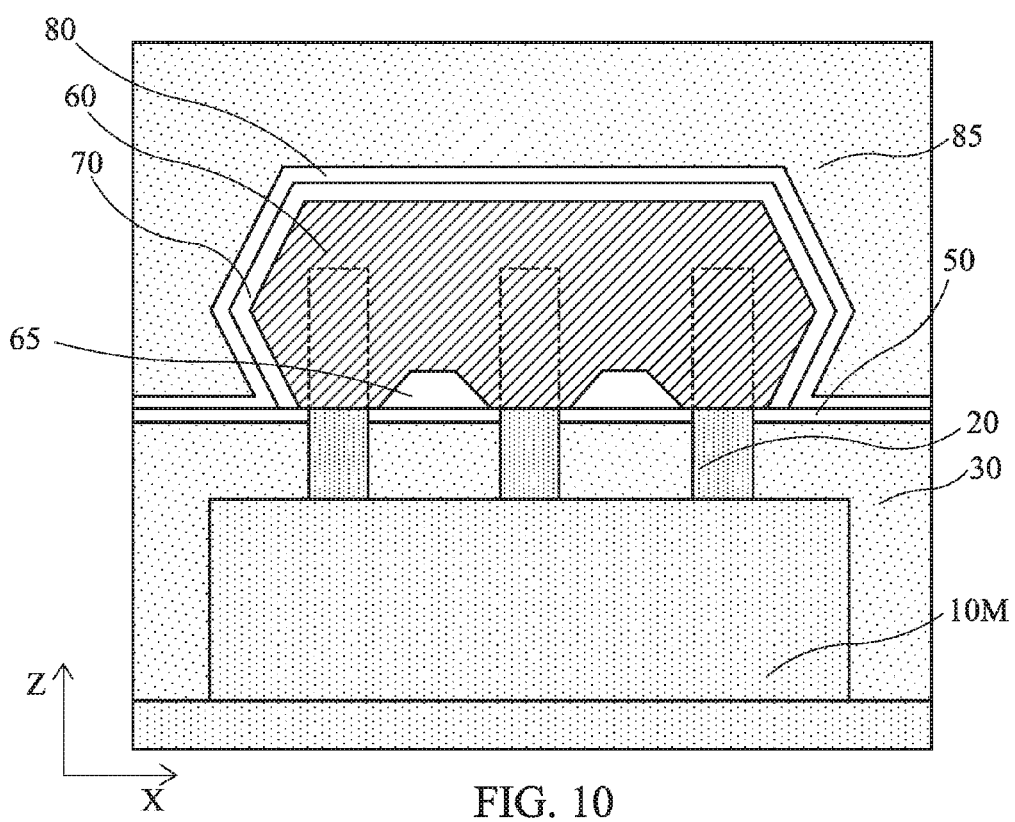

Then, as shown in FIG. 10, an insulating layer 80, functioning as a contact etching stop layer, is formed over the formed metal gate structure and the source/drain structures 60, and then the second interlayer dielectric layer 85 is formed. The insulating layer 80 is one or more layers of insulating material. In one embodiment, the insulating layer 80 is made of silicon nitride formed by CVD.

Figure 11:
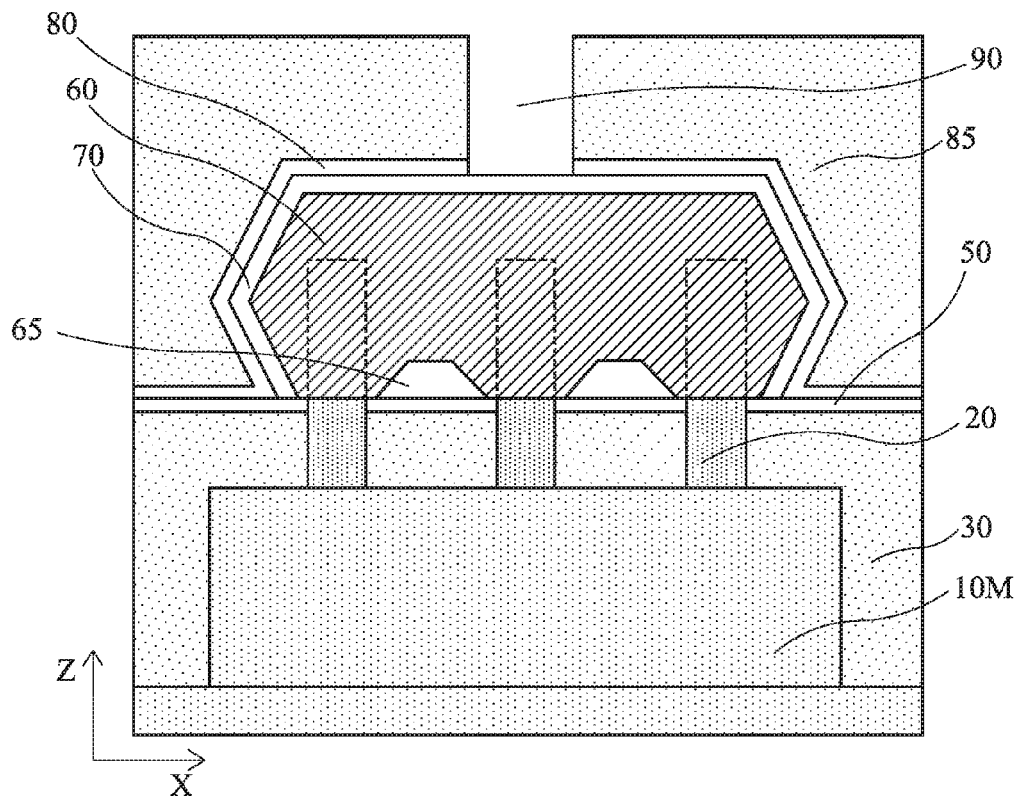

By using a patterning operation including lithography, a contact hole 90 is formed in the second interlayer dielectric layer 85 and the insulating layer 80 so as to expose the epitaxial source and drain structures 60 with the silicide layer 70, as shown in FIG. 11.

Figure 12:
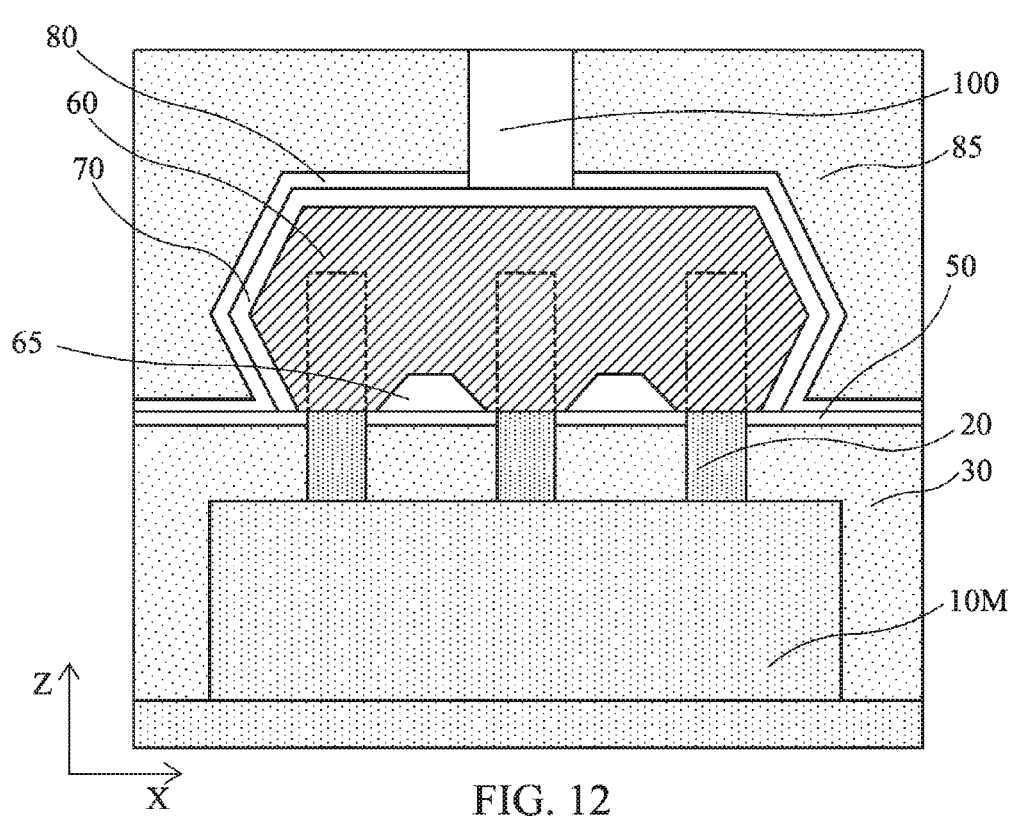

Then, the contact hole is filled with a conductive material, thereby forming a contact plug 100, as shown in FIG. 12. The contact plug 100 may include a single layer or multiple layers of any suitable metal such as Co, W, Ti, Ta, Cu, Al and/or Ni and/or nitride thereof.

After forming the contact plug, further CMOS processes are performed to form various features such as additional interlayer dielectric layer, contacts/vias, interconnect metal layers, and passivation layers, etc.

In the alternative, the silicide layer 70 is formed after the contact hole 90 is opened. In such a case, after forming the epitaxial source/drain structure 60 as shown in FIG. 8, the metal gate structures, the insulating layer 80 (contact etching stop layer) and the interlayer dielectric layer 85 are formed, without forming a silicide layer. Then, a contact hole is formed in the insulating layer 80 and the interlayer dielectric layer 85 to expose the upper surface of the epitaxial source/drain structure 60, and then a silicide layer is formed on the upper surface of the epitaxial source/drain structure 60. After forming the silicide layer, the conductive material is formed in the contact hole, thereby forming a contact plug.

Figure 13:
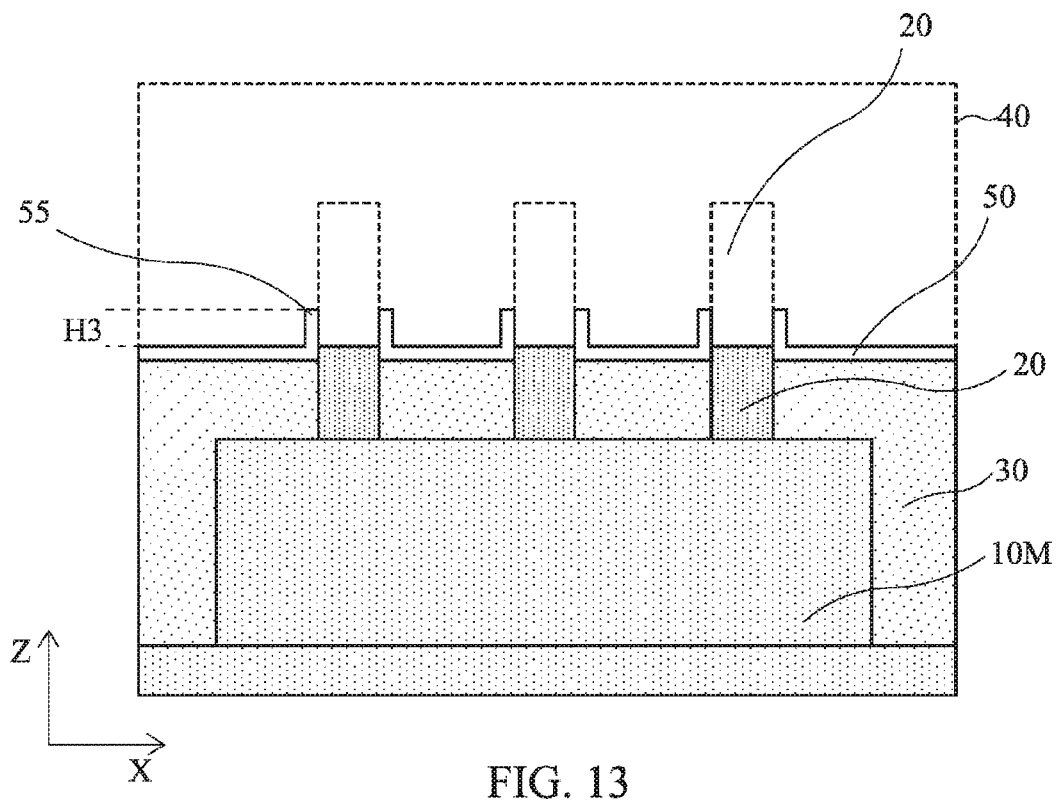
FIGS. 13 and 14 show exemplary cross sectional views of various stages for manufacturing a Fin FET device according to another embodiment of the present disclosure
Figure 14:
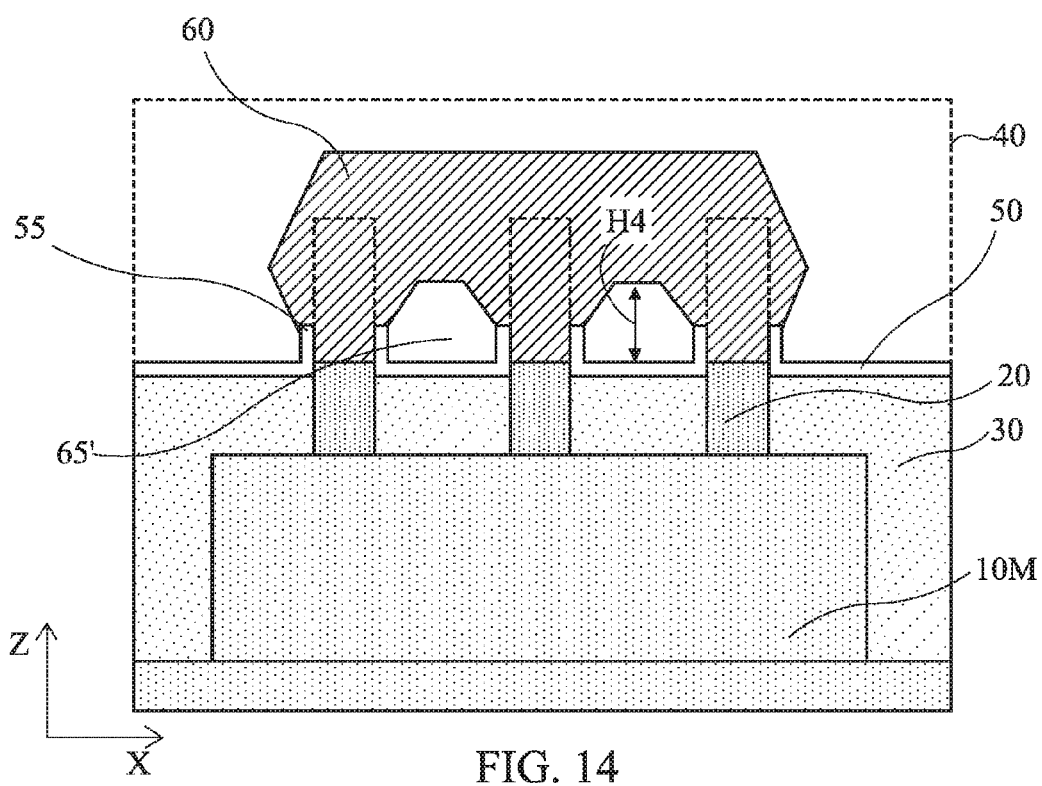

FIGS. 13 and 14 show exemplary cross sectional views of various stages for manufacturing a Fin FET device according to another embodiment of the present disclosure.

During the recess etching of the fin mask layer 50 and the fin structures 20 described with respect to FIG. 7, some lower portions of the fin mask layer 50 disposed on sidewall of the fin structures 20 remain without being etched away thereby forming sleeve-like portions 55, as show in FIG. 13. The height H3 of the sleeve-like portions 55 is in a range from about 1 nm to about 10 nm in some embodiments.

Then, similar to FIG. 8, the epitaxial source/drain structure 60 is formed, thereby forming voids 65', as shown in FIG. 14. Due to the sleeve-like portions 55, the height H4 of the voids 65' in this embodiment is greater than the height H2 in FIG. 8. The height H4 is in a range from about 20 nm to about 35 nm in some embodiments.

In the present disclosure, since a void is formed between the source/drain epitaxial layer and the isolation insulting layer (STI), a parasitic capacitance at the source/drain structure can be reduced. Further, by letting the fin mask layer (e.g., SiN) remain on the upper surface of the isolation insulating layer, the height (dimension) of the void can be larger.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a Fin FET, a first fin structure and a second fin structure are formed over a substrate. The first and second fin structures extend in a first direction in plan view. An isolation insulating layer is formed over the substrate so that lower portions of the first and second fin structures are embedded in the isolation insulating layer and upper portions of the first and second fin structures are exposed from the isolation insulating layer. A gate structure is formed over parts of the first and second fin structures. The gate structure includes a gate pattern, a dielectric layer disposed between the gate pattern and the first and second fin structures, and a cap insulating layer disposed over the gate pattern. The gate structure extends in a second direction crossing the first direction in plan view. A fin mask layer is formed on sidewalls of the first and second fin structures protruding from the isolation insulating layer and not covered by the gate structure, and on an upper surface of the isolation insulating layer. Upper portions of the first and second fin structures are recessed. A first epitaxial source/drain structure is formed over the recessed first fin structure, and a second epitaxial source/drain structure is formed over the recessed second fin structure. In the recessing upper portions of the first and second fin structures, the fin mask layer disposed on the sidewalls of the first and second fin structures are removed, while the fin mask layer disposed on the upper surface of the isolation insulating layer remains. The first and second epitaxial source/drain structures are merged such that a void is formed between the merged first and second epitaxial source/drain structures and the remaining fin mask layer on the upper surface of the isolation insulating layer.

In accordance with another aspect of the present disclosure, in a method of manufacturing a semiconductor device including a Fin FET, a first fin structure and a second fin structure are formed over a substrate. The first and second fin structures extend in a first direction in plan view. An isolation insulating layer is formed over the substrate so that lower portions of the first and second fin structures are embedded in the isolation insulating layer and upper portions of the first and second fin structures are exposed from the isolation insulating layer. A gate structure is formed over parts of the first and second fin structures. The gate structure includes a gate pattern, a dielectric layer disposed between the gate pattern and the first and second fin structures, a cap insulating layer disposed over the gate pattern. The gate structure extends in a second direction crossing the first direction in plan view. A fin mask layer is formed on sidewalls of the first and second fin structures protruding from the isolation insulating layer and not covered by the gate structure, and on an upper surface of the isolation insulating layer. Upper portions of the first and second fin structures are recessed. A first epitaxial source/drain structure is formed over the recessed first fin structure, and a second epitaxial source/drain structure is formed over the recessed second fin structure. In the recessing upper portions of the first and second fin structures, a lower portion of the fin mask layer disposed on the sidewalls of the first and second fin structures and the fin mask layer disposed on the upper surface of the isolation insulating layer remain. The first and second epitaxial source/drain structures are merged such that a void is formed between the merged first and second epitaxial source/drain structures and the remaining fin mask layer on the upper surface of the isolation insulating layer.

In accordance with another aspect of the present disclosure, a semiconductor device includes an isolation insulating layer, a first fin structure and a second fin structure, a gate structure, a source/drain structure and a dielectric layer. The isolation insulating layer is disposed over a substrate. The first fin structure and the second fin structure are both disposed over the substrate, and extend in a first direction in plan view. The gate structure is disposed over parts of the first and second fin structures, and extends in a second direction crossing the first direction. The dielectric layer is disposed on an upper surface of the isolation insulating layer. The first and second fin structures not covered by the gate structure are recessed below the upper surface of the isolation insulating layer. The source/drain structure is formed over the recessed first and second fin structures. A void is formed between the source/drain structure and the dielectric layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a Fin FET, the method comprising:
    forming a first fin structure and a second fin structure over a substrate, the first and second fin structures extending in a first direction in plan view,
    forming an isolation insulating layer over the substrate so that lower portions of the first and second fin structures are embedded in the isolation insulating layer and upper portions of the first and second fin structures are exposed from the isolation insulating layer;
    forming a gate structure over parts of the first and second fin structures, the gate structure including a gate pattern, a dielectric layer disposed between the gate pattern and the first and second fin structures, a cap insulating layer disposed over the gate pattern, the gate structure extending in a second direction crossing the first direction in plan view;
    forming a fin mask layer on sidewalls of the first and second fin structures protruding from the isolation insulating layer and not covered by the gate structure, and on an upper surface of the isolation insulating layer;
    recessing the upper portions of the first and second fin structures, thereby forming a recessed first fin structure and a recessed second fin structure; and
    forming a first epitaxial source/drain structure over the recessed first fin structure and a second epitaxial source/drain structure over the recessed second fin structure, wherein:
    in the recessing the upper portions of the first and second fin structures, the fin mask layer disposed on the sidewalls of the first and second fin structures are removed, while the fin mask layer disposed on the upper surface of the isolation insulating layer remains, and
    the first and second epitaxial source/drain structures are merged such that a void is formed between the merged first and second epitaxial source/drain structures and the remaining fin mask layer on the upper surface of the isolation insulating layer.

2. The method of claim 1, wherein the fin mask layer is formed of silicon nitride.

3. The method of claim 1, wherein in the recessing upper portions of the first and second fin structures, the first and second fin structures are recessed down below the upper surface of the isolation insulating layer.

4. The method of claim 1, further comprising, after the first and second epitaxial source/drain structures are formed:
    forming a silicide layer on the merged first and second epitaxial source/drain structures;
    forming an interlayer insulating layer;
    forming an opening in the interlayer insulating layer; and
    forming a conductive material over the silicide layer in the opening.

5. The method of claim 4, wherein the silicide layer is formed before forming the interlayer insulating layer.

6. The method of claim 4, wherein the silicide layer is formed after the opening is formed.

7. The method of claim 4, further comprising forming an insulating layer before forming the interlayer insulating layer.

8. The method of claim 1, further comprising, after the first and second epitaxial source/drain structures are formed:
    removing the cap insulating layer, the gate pattern and the dielectric layer so as to make a gate space;
    forming a gate dielectric layer in the gate space; and
    forming a gate electrode on the gate dielectric layer in the gate space.

9. A method of manufacturing a semiconductor device including a Fin FET, the method comprising:
    forming a first fin structure and a second fin structure over a substrate, the first and second fin structures extending in a first direction in plan view,
    forming an isolation insulating layer over the substrate so that lower portions of the first and second fin structures are embedded in the isolation insulating layer and upper portions of the first and second fin structures are exposed from the isolation insulating layer;
    forming a gate structure over parts of the first and second fin structures, the gate structure including a gate pattern, a dielectric layer disposed between the gate pattern and the first and second fin structures, a cap insulating layer disposed over the gate pattern, the gate structure extending in a second direction crossing the first direction in plan view;
    forming a fin mask layer on sidewalls of the first and second fin structures protruding from the isolation insulating layer and not covered by the gate structure, and on an upper surface of the isolation insulating layer;

recessing the upper portions of the first and second fin structures, thereby forming a recessed first fin structure and a recessed second fin structure; and forming a first epitaxial source/drain structure over the recessed first fin structure and a second epitaxial source/drain structure over the recessed second fin structure, wherein:

in the recessing the upper portions of the first and second fin structures, the fin mask layer disposed in the sidewalls of the first and second fin structures are removed, while the fin mask layer disposed on the upper surface of the isolation insulating layer between the first fin structure and second fin structure remains, and the first and second epitaxial source/drain structures are merged such that a void is formed between the merged first and second epitaxial source/drain structures and the remaining fin mask layer on the upper surface of the isolation insulating layer.

10. The method of claim 9, wherein the fin mask layer is formed of silicon nitride.

11. The method of claim 9, wherein in the recessing upper portions of the first and second fin structures, the first and second fin structures are recessed down below the upper surface of the isolation insulating layer.

12. The method of claim 9, further comprising, after the first and second epitaxial source/drain structures are formed:
forming a silicide layer on the merged first and second epitaxial source/drain structures;
forming an interlayer insulating layer;
forming an opening in the interlayer insulating layer; and
forming a conductive material over the silicide layer in the opening.

13. The method of claim 9, further comprising, after the first and second epitaxial source/drain structures are formed:
forming a silicide layer on the merged first and second epitaxial source/drain structures;
after forming the silicide layer, forming an interlayer insulating layer;
forming an opening in the interlayer insulating layer; and
forming a conductive material over the silicide layer in the opening.

14. The method of claim 13, further comprising forming an insulating layer before forming the interlayer insulating layer.

15. The method of claim 9, further comprising, after the first and second epitaxial source/drain structures are formed:
removing the cap insulating layer, the gate pattern and the dielectric layer so as to make a gate space;
forming a gate dielectric layer in the gate space; and
forming a gate electrode on the gate dielectric layer in the gate space.

16. The method of claim 15, further comprising forming an insulating layer before forming the interlayer insulating layer.

17. A method of manufacturing a semiconductor device including a Fin FET, the method comprising:

forming a first fin structure, a second fin structure and a third fin structure over a substrate, the first, second and third fin structures extending in a first direction in plan view, forming an isolation insulating layer over the substrate so that lower portions of the first, second and third fin structures are embedded in the isolation insulating layer and upper portions of the first, second and third fin structures are exposed from the isolation insulating layer;

forming a gate structure over parts of the first, second and third fin structures, the gate structure including a gate pattern, a dielectric layer disposed between the gate pattern and the first, second and third fin structures, a cap insulating layer disposed over the gate pattern, the gate structure extending in a second direction crossing the first direction in plan view;

forming a fin mask layer on sidewalls of the first, second and third fin structures protruding from the isolation insulating layer and not covered by the gate structure, and on an upper surface of the isolation insulating layer;

recessing the upper portions of the first, second and third fin structures, thereby forming a recessed first fin structure, a recessed second fin structure and a recessed third fin structure; and forming a first epitaxial source/drain structure over the recessed first fin structure, a second epitaxial source/drain structure over the recessed second fin structure and a third epitaxial source/drain structure over the recessed third fin structure, wherein:

in the recessing the upper portions of the first, second and third fin structures, the fin mask layer disposed on the sidewalls of the first, second and third fin structures are removed, while the fin masks layer disposed on the upper surface of the isolation insulating layer between the first fin structure and second fin structure and between the second fin structure and the third fin structure remains, and the first, second and third epitaxial source/drain structures are merged such that a first void is formed between the merged first and second epitaxial source/drain structures, a second void is formed between the merged second and third epitaxial source/drain structures and the remaining fin mask layer on the upper surface of the isolation insulating layer.

18. The method of claim 17, wherein the fin mask layer is formed of silicon nitride.

19. The method of claim 17, wherein in the recessing upper portions of the first and second fin structures, the first and second fin structures are recessed down below the upper surface of the isolation insulating layer.

20. The method of claim 17, further comprising, after the first and second epitaxial source/drain structures are formed:
forming a silicide layer on the merged first and second epitaxial source/drain structures;
forming an interlayer insulating layer;
forming an opening in the interlayer insulating layer; and
forming a conductive material over the silicide layer in the opening.

* * * * *